United States Patent
Smith, IV et al.

(10) Patent No.: US 9,623,646 B2
(45) Date of Patent: Apr. 18, 2017

(54) REDUCING COSMETIC SURFACE INTERFERENCE FROM EMBEDDED COMPONENTS

(71) Applicant: Apple Inc., Cupertino, CA (US)

(72) Inventors: Harry W. Smith, IV, San Francisco, CA (US); Peter F. Coxeter, Cupertino, CA (US); Jonathan T. Mechak, Santa Clara, CA (US); Adam L. Nekimken, Stanford, CA (US); Julio C. Quintero, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 205 days.

(21) Appl. No.: 14/259,907

(22) Filed: Apr. 23, 2014

(65) Prior Publication Data

US 2015/0158284 A1 Jun. 11, 2015

Related U.S. Application Data

(60) Provisional application No. 61/914,846, filed on Dec. 11, 2013.

(51) Int. Cl.
| | |
|---|---|
| *B32B 38/10* | (2006.01) |
| *B32B 38/00* | (2006.01) |
| *B29C 59/02* | (2006.01) |
| *H01L 21/56* | (2006.01) |

(52) U.S. Cl.
CPC .......... *B32B 38/0004* (2013.01); *B29C 59/02* (2013.01); *B32B 38/10* (2013.01); *H01L 21/568* (2013.01); *B32B 2317/08* (2013.01); *B32B 2457/00* (2013.01); *Y10T 156/1026* (2015.01); *Y10T 156/12* (2015.01)

(58) Field of Classification Search
None
See application file for complete search history.

(56) References Cited

U.S. PATENT DOCUMENTS

| | | | |
|---|---|---|---|
| 4,731,139 A | * | 3/1988 | Feyerabend ............ B29C 59/00 156/154 |
| 7,267,737 B2 | | 9/2007 | Neri et al. |
| 8,206,536 B2 | | 6/2012 | Kim et al. |
| 2011/0293887 A1 | | 12/2011 | Sommerfeld |
| 2013/0032049 A1 | | 2/2013 | Hong et al. |
| 2014/0043748 A1 | | 2/2014 | Sartee et al. |

\* cited by examiner

*Primary Examiner* — Barbara J Musser
(74) *Attorney, Agent, or Firm* — Downey Brand LLP

(57) ABSTRACT

The described embodiments relate to a method for embedding one or more electrical components in a flexible substrate. The method includes receiving a substrate of a flexible material, wherein the substrate includes a cosmetic surface and an opposing surface. The method further includes applying a carrier form to the substrate to create a carrier assembly, wherein the carrier form includes one or more positive images representative a design to be transferred to the opposing surface of the substrate. The method further includes removing or cutting a portion of material from the opposing surface of the substrate to form a new opposing surface. Subsequently, the carrier form is removed from the substrate to reveal one or more embedding cavities extending into the substrate at the new opposing surface. In some embodiments, the embedding cavities can thereafter receive one or more electrical components.

20 Claims, 16 Drawing Sheets

REDUCING COSMETIC SURFACE INTERFERENCE FROM EMBEDDED COMPONENTS

CROSS-REFERENCE TO RELATED APPLICATIONS

The present application claims the benefit of U.S. Provisional Application No. 61/914,846, entitled "REDUCING COSMETIC SURFACE INTERFERENCE FROM EMBEDDED COMPONENTS" filed Dec. 11, 2013, the content of which is incorporated herein by reference in its entirety for all purposes.

FIELD

The described embodiments relate generally to cosmetic surfaces and more particularly to reducing or minimizing interference with a cosmetic surface by embedded components.

BACKGROUND

Generally, various consumer devices can include a cosmetic surface. The cosmetic surface can be a part of a cover, tag, case, housing, or other suitable item, and can include desirable features such as an even finish, feel, and texture. The cosmetic surface is sometimes disposed along a portion of a car, airplane, train, bicycle, motorcycle seat, handlebar/steering wheel, ski poles, tennis/squash racket, golf club, shoe, clothing, garment, and/or wearable component. As technology advances, such consumer devices are incorporating different components and/or mediums within the cosmetic surface to increase the functionality of the consumer devices. However, cosmetic surface materials used in covering or creating covers, tags, cases, housings, or other items can be relatively flexible and/or thin. Therefore, any component embedded therein can disrupt the overlying cosmetic surface and reduce a user's experience as compared to a more appealing surface. Moreover, increasing the thickness of the material to limit cosmetic surface disruption can increase overall bulk and further reduce a user's experience.

SUMMARY

This paper describes various embodiments that relate to embedding components beneath a cosmetic surface of a flexible material.

In one embodiment, a method of processing material for embedding at least one object or design in a substrate of flexible material is disclosed. The substrate includes a cosmetic surface and an opposing surface. The method includes processing the substrate to a desired working thickness and applying a carrier form to the substrate to create a carrier assembly. The carrier form includes one or more positive images representative of the object to be embedded in the substrate of the flexible material. Further, the method includes removing a portion of substrate from the opposing surface to form a reduced opposing surface.

Another embodiment set forth herein is a system for removing a layer of substrate from a flexible material. The system includes a carrier form configured to receive a flexible material. The carrier form can include one or more positive images representative of a design to be embedded in the substrate of the flexible material. The system can also include a roller configured to move the carrier form and substrate and a blade configured to cut the substrate when the roller moves the carrier form and substrate toward the blade. As a result of cutting the substrate, the design from the carrier form is formed in the substrate.

Another embodiment disclosed herein is a non-transitory computer readable medium having instructions stored thereon such that when executed by a processor, the processor performs the method of processing material for embedding at least one electrical component in a substrate of flexible material. The method includes a step of receiving a carrier form and a substrate of the flexible material. Additionally, the method includes the step of removing a portion of substrate engaged by the carrier form, such that the electrical component can be embedded into the substrate.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. These drawings are not necessarily drawn to scale. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Figure 1:
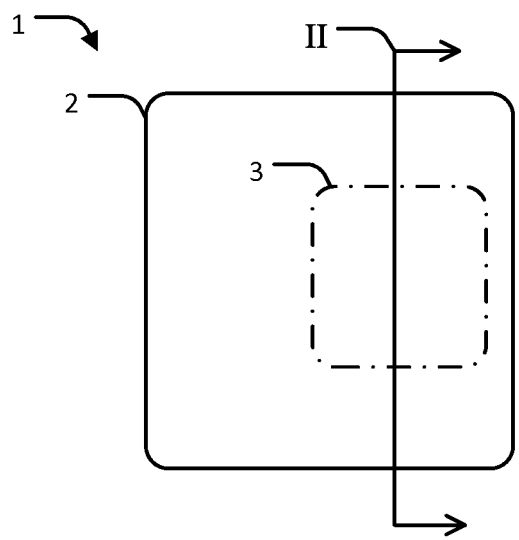
FIG. 1 shows a conventional material with a component embedded therein.

Representative applications of methods and apparatus according to the present application are described in this section. These examples are being provided solely to add context and aid in the understanding of the described embodiments. It will thus be apparent to one skilled in the art that the described embodiments can be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments can be used, and changes can be made without departing from the spirit and scope of the described embodiments.

A trend in some modern electronic devices is to increase aesthetics and functionality. Generally, a user may desire a case, housing, or additional covering for any number of devices or items. The case can include at least one cosmetic surface that is aesthetically pleasing. This cosmetic surface can be an overlying surface made of a relatively flexible material, such as, for example, leather, neoprene, synthetic leather, cork, plastic, silicone, or any other suitable material. It is generally understood that if the material covers or obscures a display or user interface, a user may remove or deflect the material to use the device. For example, a cover with hinged portions can be deflected and folded such that at least a portion of the user interface or display is useable. Thus, the cover can allow protection of the user interface when not in use, and be relatively easily altered to allow use of the user interface. However, as the material of the cover is relatively passive in conventional technology, and because the cover is generally carried with a personal electronic device, it can be beneficial to adapt the cover to include additional functionality beyond that of protection or to increase its ability to protect, for example, through the embedding of functional components.

The embodiments described herein provide improvements to the aforementioned devices and accessories. In one embodiment, a method of processing material for embedding at least one object or design in a substrate of flexible material is disclosed. The substrate includes a cosmetic surface and an opposing surface. The method includes processing the substrate to a desired working thickness and applying a carrier form to the substrate to create a carrier assembly. The carrier form includes one or more positive images representative of the object to be embedded in the substrate of the flexible material. Further, the method includes removing a portion of substrate from the opposing surface to form a reduced opposing surface. The reduced opposing surface can be configured to receive an electrical component. In some embodiments, the method includes a substrate formed from at least one of leather, synthetic leather, rubber, silicone, neoprene, cork, plastic, and felt. A second material can be applied to the reduced opposing surface to obscure the received electrical component.

Additionally, the method can include rotating a roller and a blade simultaneously so that the roller pulls the carrier form closer to the blade, and the blade cuts a portion of the substrate. The carrier form can cause the substrate to deform when the blade makes contact with the substrate such that the thickness or density of the substrate moving above or below the blade during cutting varies during the cutting process. In some embodiments, the carrier form includes a design that improves a physical characteristic of the substrate. Examples of improved physical characteristics can be increased flexibility, a fold, a hinge, or an ornamental design.

Another embodiment set forth herein is a system for removing a layer of substrate from a flexible material. The system includes a carrier form configured to receive a flexible material. The carrier form can include one or more positive images representative of a design to be embedded in the substrate of the flexible material. The system can also include a roller configured to move the carrier form and substrate and a blade configured to cut the substrate when the roller moves the carrier form and substrate toward the blade. As a result of cutting the substrate, the design from the carrier form is formed in the substrate. The design embedded in the substrate can be representative of an electrical component. In some embodiments, the carrier can be configured to deform the substrate when the blade makes contact with the substrate such that the thickness or density of the substrate moving above or below the blade varies simultaneously with the cutting process. The flexible material or substrate can be leather or imitation leather, and the electrical component represented by the design can be an antenna. The roller of the system can be configured to move both the carrier form and substrate toward and away from the blade after the blade has made contact with the substrate.

Another embodiment disclosed herein is a non-transitory computer readable medium having instructions stored thereon such that when executed by a processor, the processor performs the method of processing material for embedding at least one object or design in a substrate of flexible material. The method includes a step of processing of the substrate to a desired working thickness. The substrate can have a cosmetic surface and an opposing surface. The method further includes applying a carrier form to the substrate to create a carrier assembly such that the carrier form includes one or more positive images representative of the object to be embedded in the substrate of the flexible material.

After the carrier form is applied to the substrate, a portion of substrate is removed from the opposing surface to form a reduced opposing surface. The reduced opposing surface can be configured to receive an electrical component. A second material can be applied to the reduced opposing surface to obscure the received electrical component. In some embodiments the substrate is formed from at least one of leather, synthetic leather, rubber, silicone, neoprene, cork, plastic, and felt. The method can further include rotating a roller and a blade simultaneously, wherein the roller pulls the carrier form closer to the blade, and the blade cuts a portion of the substrate. In some embodiments the carrier form causes the substrate to deform such that when the blade makes contact with the substrate the thickness or density of the substrate moving above or below the blade during cutting varies during the cutting process. In another embodiment, a portion of the substrate that moved below the blade during cutting is discarded, and a portion of the substrate that moved above the blade during cutting is retained for further use or processing.

Figure 2:
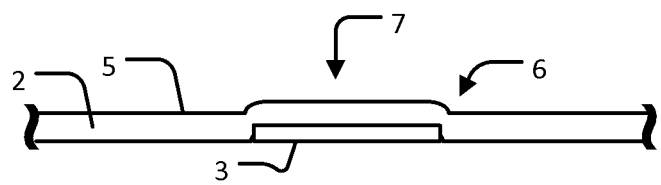
FIG. 2 shows a cross section of the conventional material of FIG. 1.

FIG. 1 shows a conventional material 1 with a component embedded therein. As shown, the material 1 includes a substrate 2 and a component 3 embedded within the substrate 2. FIG. 2 shows a cross section of the conventional material 1 of FIG. 1, wherein the cross-sectional view of FIG. 1 is illustrated relative to section II shown in FIG. 1. As shown in FIG. 2, area 7 above component 3 is deflected outwards due to interference of the cosmetic surface 5 by a width, girth, and depth of the component 3. Furthermore, deflected area 6 outlining the component 3 along the cosmetic surface 5 is readily apparent. Thus, although the component 3 can increase functionality of the material 1 and the device in which it can be incorporated, the appeal of cosmetic surface 5 is reduced by the deflection caused by the component 3.

However, according to an embodiment of the present invention, components such as component 3 can be readily embedded in any suitable material after processing through one or more of the methods described herein. Material processed through this method can allow for embedding of components, materials, or other objects while reducing cosmetic interference, and/or introducing ornamental designs or other functionality. Hereinafter, embodiments of the present invention are described in detail with reference to the many figures.

Figure 3:
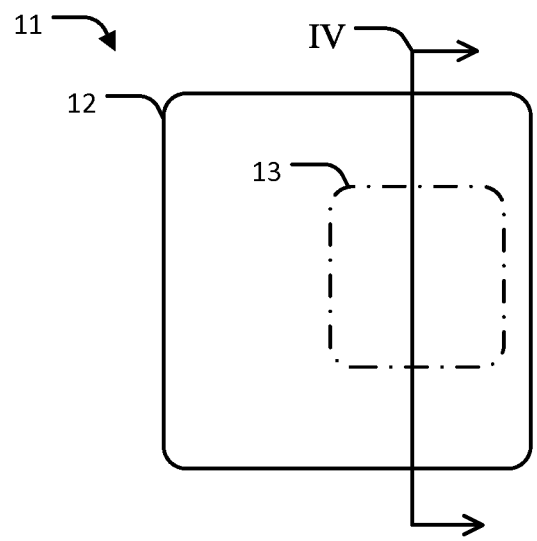
FIG. 3 shows a portion of a material with a component embedded.

FIG. 3 shows a portion of material 11 with a component embedded therein in accordance with an embodiment of the present invention. As shown, the material 11 includes a substrate 12 and a component 13 embedded within the substrate 12. The substrate 12 can be formed of any suitable and relatively flexible material. According to one embodiment, substrate 12 is formed of non-woven material (e.g., leather). In other embodiments, substrate 12 is formed from one or more layers of material such as leather, synthetic leather, neoprene, silicone, plastic, laminated plastic, rubber, laminated rubber, cork, felt, or any other suitable material capable of having a portion thereof removed through a splitting or cutting process.

Regarding component 13, it should be understood that component 13 can comprise any suitable passive or active component or object. For example, component 13 can include one or more conductors, flexible or "flex" cabling, antennas, magnets, sensors, computer chips, processors, integrated circuits, or any suitable combination thereof. Additionally, component 13 can include additional material applied thereon to obscure, attach, support, or otherwise interact with the component 13 and substrate 12. The component 13 can also include a layer of material configured to support the cosmetic surface 15 while providing differing flexibility as compared to adjacent areas of material. Additionally, component 13 can include adhesive or fixative material configured to maintain positioning within an embedding cavity. The substrate 12 and component 13 can be altered, configured, or arranged according to one or more of the examples above without departing from the spirit and scope of this disclosure.

Figure 4:
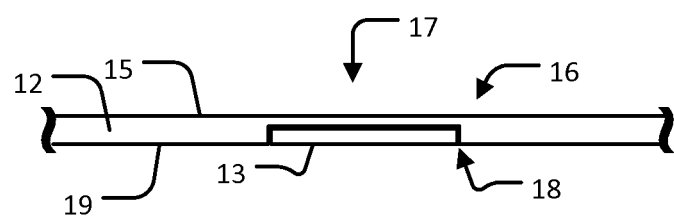
FIG. 4 shows a cross section of the portion of the material of FIG. 3.

Turning to FIG. 4, a cross section of the portion of material 11 of FIG. 3 is depicted relative to a slice IV shown in FIG. 3. As illustrated in FIG. 4, area 17 above the component 13 is relatively undisturbed and remains aesthetically pleasing without interference to the cosmetic surface 15 by a width, girth, and depth of the component 13. For example, edges 16 of the component 13 are not readily visible on the surface 15 due to an embedding cavity or void 18 being created through an underlying surface 19. The cavity 18 can be configured to receive and support the component 13 thereby allowing its embedding in substrate 12 without disrupting the cosmetic surface 15. In this way, functionality of the material 11 can be improved or increased while not detracting from otherwise aesthetically pleasing attributes as compared to a passive cover or material for use with a personal electronic device.

Figure 5:
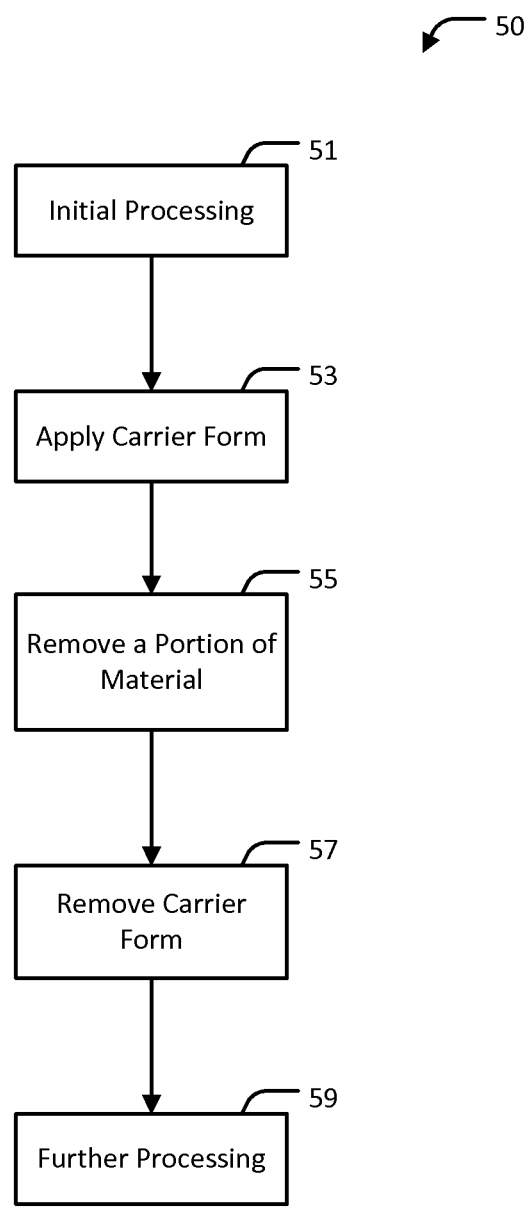
FIG. 5 shows a flowchart of a method of processing material for embedding one or more components.

Hereinafter, methods of processing materials such as material 11 are described in detail with additional reference to carrier forms configured to created cavities similar to cavity 18. The method 50 of FIG. 5 shows the step of processing material for embedding of one or more components in accordance with an embodiment of the present invention. The method 50 includes initial processing of a substrate or material at block 51. For example the material or substrate can be substantially similar to the examples listed above with reference to substrate 12. The initial processing can include leather tanning, application of chemicals, stretching, polishing, sealing, or any other suitable technique. The initial processing can also include splitting or milling material to an appropriate working thickness. The initial processing can be omitted if the requisite substrate or material is already prepared, in some embodiments.

Figure 6A:
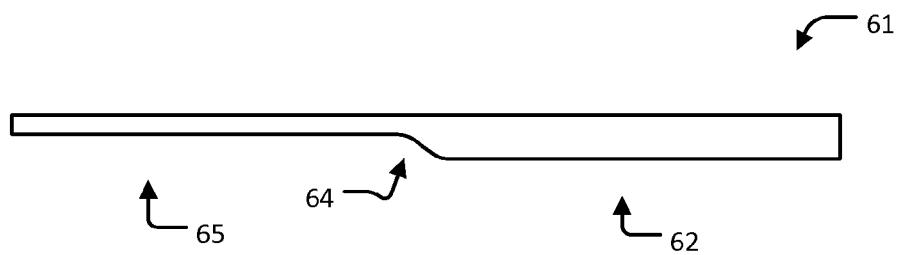
FIG. 6A shows an elevation view of a carrier form for processing.
Figure 6B:
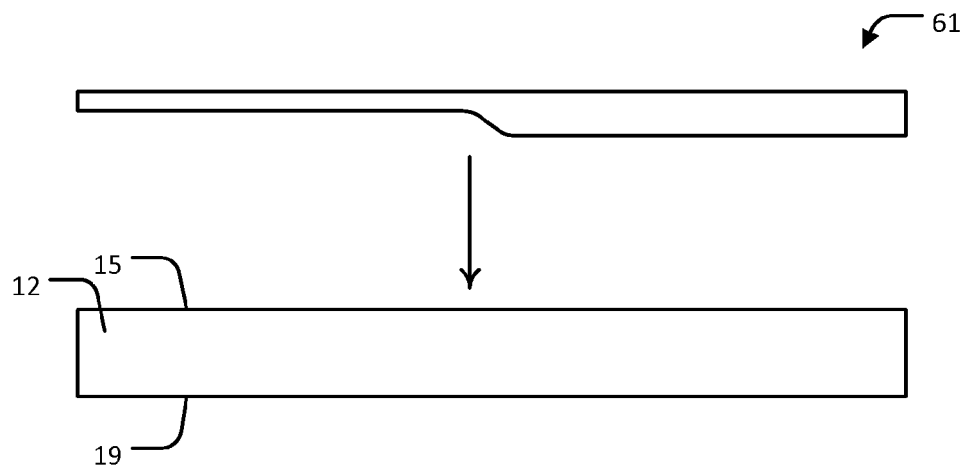
FIG. 6B shows application of the carrier form of FIG. 6A to a portion of material for processing.

The method 50 further includes applying a carrier form to the processed material or substrate at block 53. An example of applying the carrier form of block 53 is illustrated in FIGS. 6A and 6B. FIG. 6A shows an elevation view of a carrier form for processing material. FIG. 6B shows application of the carrier form of FIG. 6A to a portion of material for processing. The carrier form 61 can be applied to the substrate 12 against the cosmetic surface 15 such that a positive image 62 on the carrier form 61 is transferred to the underlying surface 19. Pressure-sensitive adhesive, glue, or other fixative techniques can be used in attaching the carrier 61 to the substrate 12.

Figure 6C:
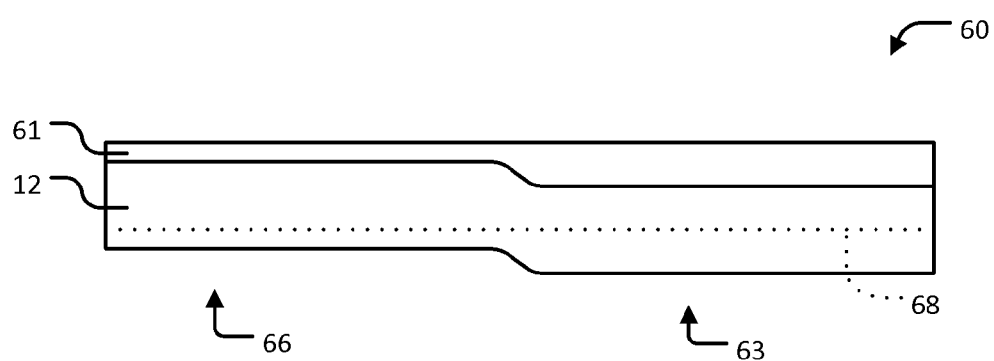
FIG. 6C shows the applied carrier form of FIG. 6B.

FIG. 6C shows the applied carrier form of FIG. 6B, the resulting positive image 63, associated flat areas 66, and a target cut-line 68 for material removal at the target cut-line 68. The target cut-line 68 is cut at block 55 in the method of FIG. 5. Upon attachment of the carrier form 61 to form a carrier assembly 60, the method 50 includes removing a portion of material by cutting approximately along the cutline 68 at block 55. For example, FIG. 7 shows a schematic of a system 70 for processing material in accordance with an embodiment of the present invention for removal of material from a carrier assembly 60.

The carrier form 61 of the carrier assembly 60 can be formed of a relatively flexible material such as plastic. The carrier form 61 can also be formed of wood, machined metal, glass-epoxy laminate, or any suitable material which allows for sufficient flexibility as described below. The carrier form can include a positive image 62 of a desired embedding cavity, impression, or weakened area. In this way the positive image 62 or impression resembles a stamp that is pressed onto the substrate and the portion of the substrate that receives the positive image 62 or stamp becomes the embedding cavity or weakened area. Generally, a dimensional relationship between a depth of the positive image 62 and a resulting image in an applied state is approximately 1:1. Alternative ratios are also possible depending upon a processing technique used in material removal described more fully below. The carrier form 61 can also include relatively flat areas 65 which are representative of areas in which no material or relatively less material is removed as compared to the positive image area 62. Additionally, there can be gradient or transitional areas 64 such that relatively smooth transitions are created on an underlying surface and resulting embedding cavity. The shape and functionality of the carrier form 61 can be substantially different than that listed above and illustrated depending upon any desired configuration of embedding cavity(ies) to be formed in the material or substrate 12. The examples listed above and described below in connection with a material removal process are non-exhaustive.

Figure 7:
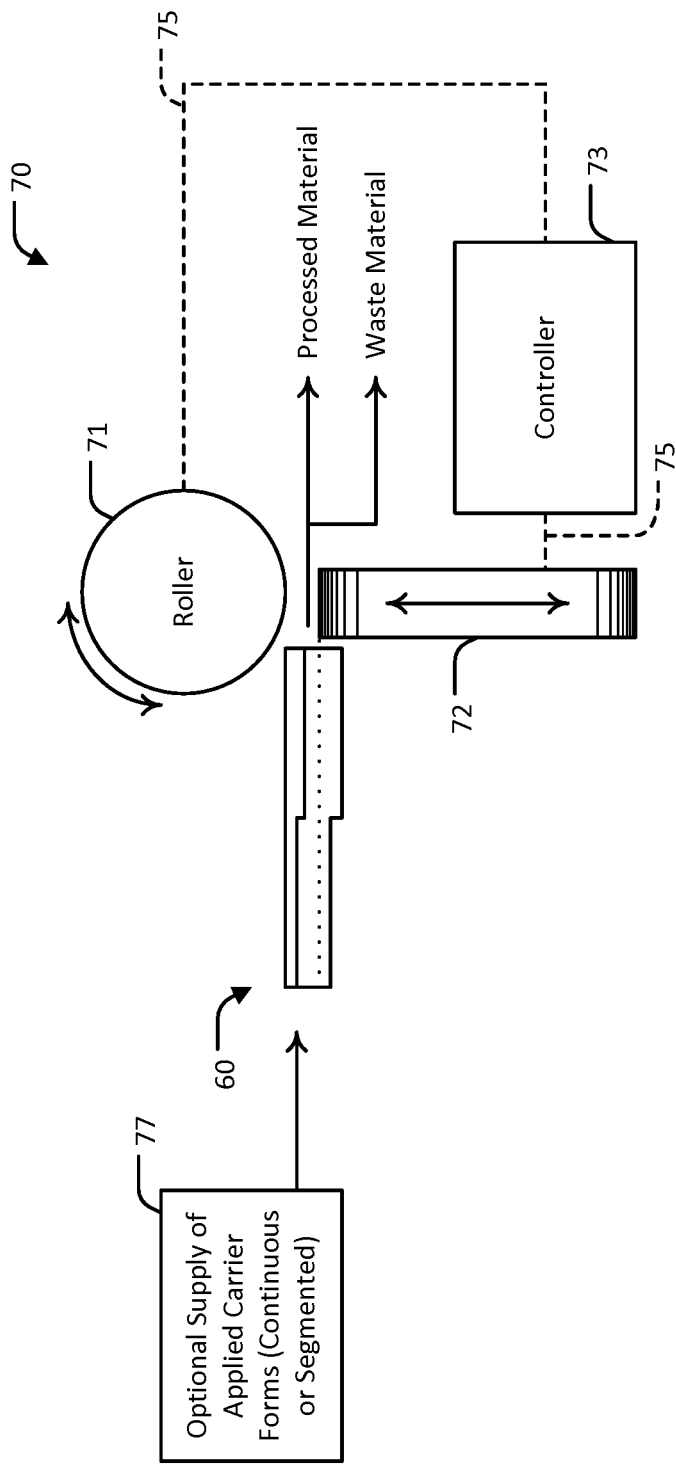
FIG. 7 shows a schematic of a system for processing the material.

As shown in FIG. 7, the system 70 can include a pressure roller or drive roller 71 configured to rotate, contact, and move the carrier assembly 60 from a supply 77 of carrier assemblies across a cutting implement 72. The roller 71 and cutting implement 72 can be controlled through controller 73, or through multiple user interactions, and/or in combination with one or more controllers via communication mediums 75 suitable for sending electrical or wireless signals. The roller 71 can include an adjustable z-height or pressure which can deform the carrier assembly 60 to ensure removal of material within a desired specification or margin of error. The carrier form 61 should be flexible enough to allow processing through the roller 71 in some embodiments. In other embodiments, the carrier form 61 can be substantially more rigid.

In some embodiments, the cutting implement 72 can include a rotary blade, band-saw blade, alternating or oscillating blade, grinding wheel or blade, milling machine, or any other suitable cutting implement. According to at least one embodiment, the cutting implement 72 is a band or ribbon blade can be configured to move in a direction substantially parallel to an axis of rotation of the roller 71. This portion can be an active cutting portion configured to remain aligned or substantially aligned with the cutline 68. As the carrier assembly 60 moves towards and against the cutting implement 72, processed material and waste material can be gathered in any suitable manner.

The roller 71 is configured to control the movement of the carrier assembly 60 and can shift the carrier assembly 60 in a variety of directions. For example the carrier assembly 60 can be alternated from moving into and out of the cutting implement 72 and/or rotated while doing so, to create edges or other features in the substrate 12. Moreover, the roller 71 can rotate at the same or a different speed than the cutting implement 72. The speed at which the roller 71 and cutting implement 72 rotate can each be set such that each can be constant, one can be faster than the other, or one or both can rotate at speeds that vary as the carrier assembly 60 is moved through the system 70.

Figure 8A:
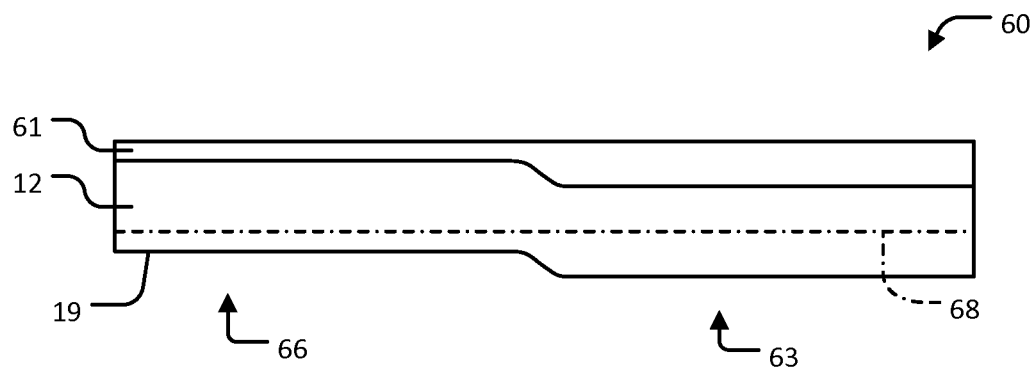
FIG. 8A shows a cross section and cut line of the applied carrier form of FIG. 6B.
Figure 8B:
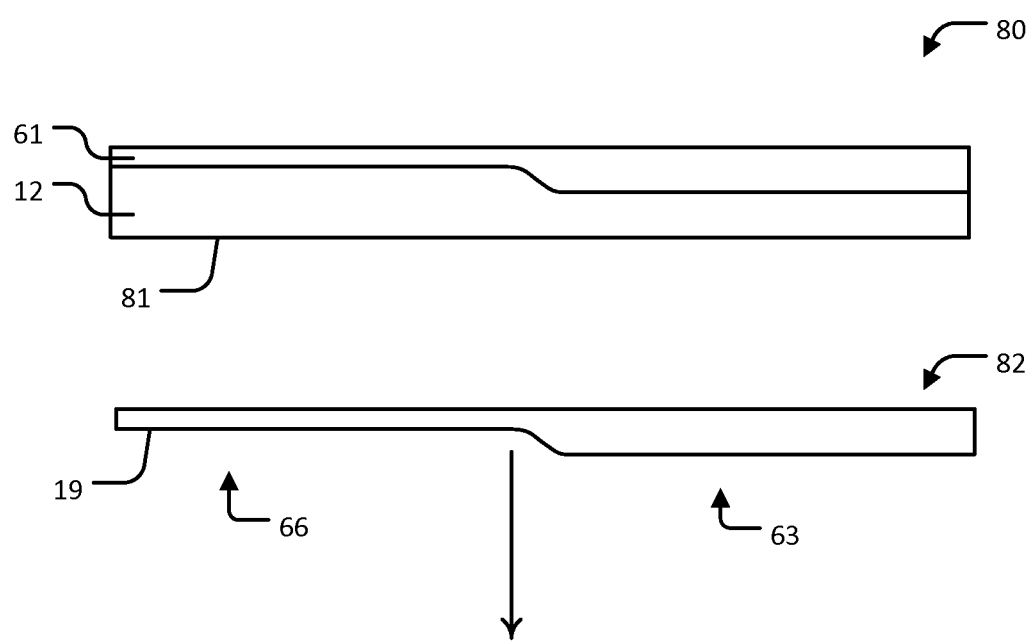
FIG. 8B shows the removal of material from the applied carrier form of FIG. 8A.
Figure 8C:
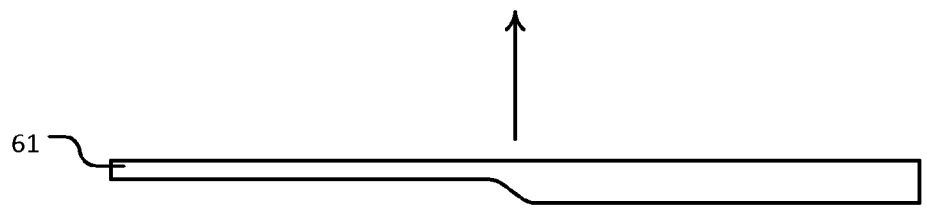
FIG. 8C shows the removal of the carrier form after removal of material of FIG. 8B.
Figure 8C:
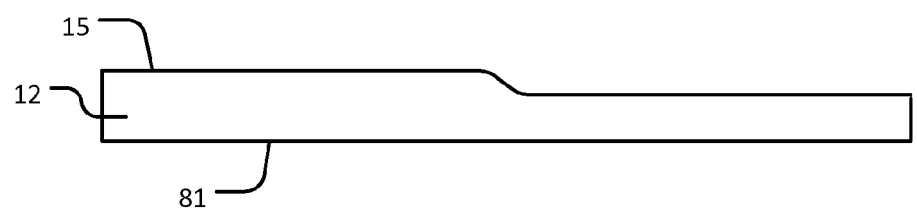

A cross section and cut line of the carrier assembly 60 is illustrated in FIG. 8A. After the carrier assembly 60 passes through the cutting implement 72, the cut material is removed from the carrier assembly 60, as illustrated in FIG. 8B. Subsequently at step 57 of FIG. 5, the carrier form 61 is removed after the cut material, as illustrated in FIG. 8C. The waste material 82 can be removed from the carrier assembly (FIG. 8B), and the carrier form 61 can be removed from the processed material 82 (FIG. 8C). A new underlying surface 81 is formed along the cutline 68 which will form an interior surface that includes the substrate and any resulting embedded cavity(ies).

Figure 8D:
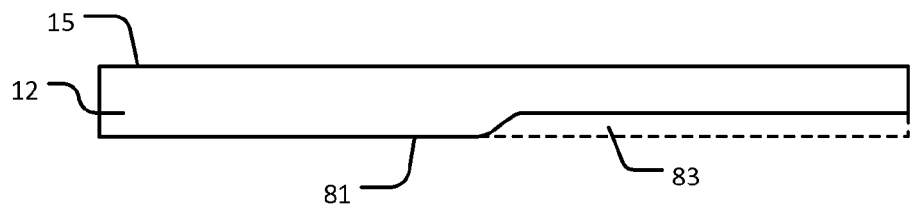
FIG. 8D shows an embedding cavity formed through removal of the carrier form of FIG. 8C.

FIG. 8D shows an embedding cavity 83 formed through removal of the carrier form after material processing. As shown, tension along or proximate to the cosmetic surface 15 results in reconfiguration of the substrate 12 such that the cosmetic surface is relatively flatter than before processing in FIG. 6B. The cavity 83 is a negative image or impression of the positive image 64. The tension of the cosmetic surface 15 would generally be located about the transitional areas 64 of the carrier form 61. However, in some embodiments, depending upon a particular material comprising the substrate 12, more or less tension can be apparent, and leveling of the cosmetic surface 15 can require further processing to relax or stiffen the material.

The final step enumerated in method 50 is removing the carrier form 61 from the processed substrate for further processing at block 59. Further processing is herein meant to reflect any steps suitable for processing the processed substrate after removal from the carrier assembly. In some embodiments further processing is not necessary. In other embodiments the processed substrate is further processed by adding other layers of the same or different materials (e.g., other non-woven materials, woven materials, different colored materials, polishes, metals, non-metals, conductors, non-conductors, semi-conductors, etc.). Additionally, further processing can include treating the processed substrate with firming or reinforcing materials. Moreover, further processing can be for improving aesthetics in order to make the processed substrate more appealing to a consumer.

Although some embodiments herein include forming a single cavity in connection with a single positive image on a carrier form, it is understood that such embodiments can be varied in many ways. For example, multiple positive images can be arranged on a carrier form such that more or less complex resulting cavities, or reduced surface/substrate regions, are created through the described or compatible cutting processes.

Figure 9A:
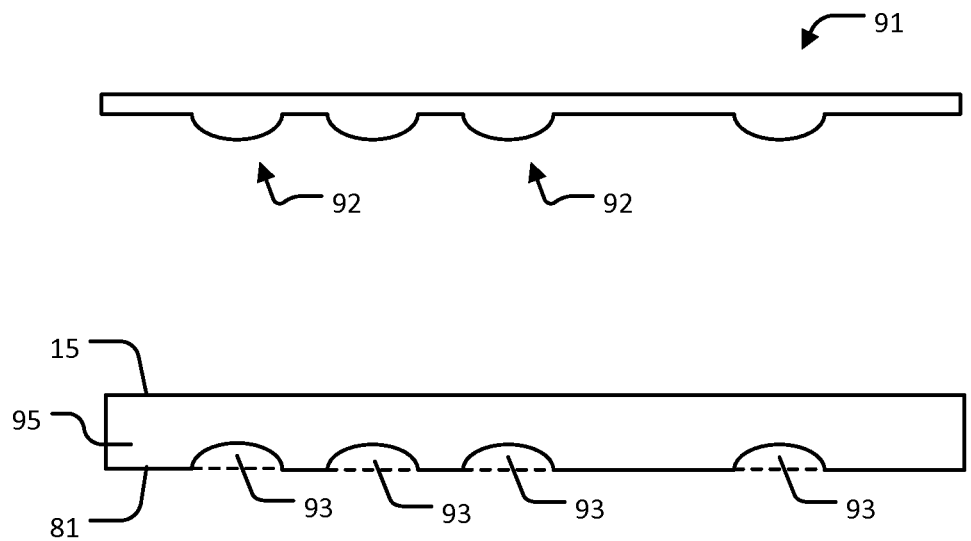
FIGS. 9A-9H show a plurality of different possible carrier forms and resulting embedding cavities and resulting cosmetic features.
Figure 9B:
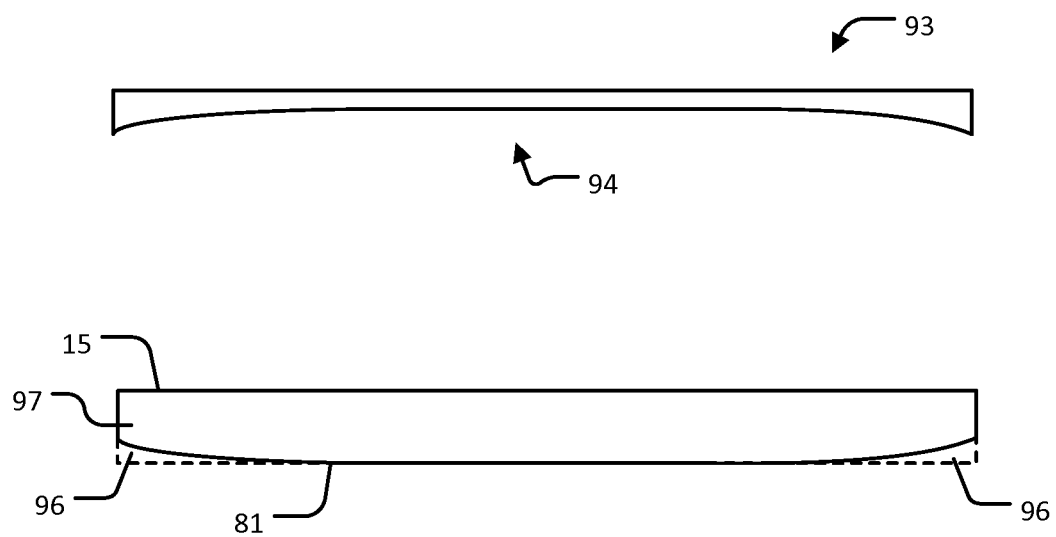

Examples of such arrangements are included in FIGS. 9A-9H. Specifically, FIGS. 9A-9H show a plurality of different possible carrier forms and resulting embedding cavities and resulting cosmetic features, in accordance with embodiments of the present invention. As illustrated in FIG. 9A, a plurality of positive images 92 can be arranged on a carrier form 91 to create the cavities 93 in substrate 95. This can allow for long cavities for routing conductors or creating hinges/weakened areas. This can also allow for embedding of a plurality of individual components such as sensors, magnets, or other components. In FIG. 9B, edges of the substrate 97 are reduced to create gradient transitional edges which can be useful in creating edges for a device cover or displaying multiple layers of material comprising the substrate 97 (e.g., in a striped cosmetic effect). The reduced edges 96 are created through a gradient concave formation 94 in the carrier form 93. The reduced edges 96 can take other forms to aid in folding over edges of the substrate 97, to aid in routing perimeter conductors, or for any other suitable function.

Figure 9C:
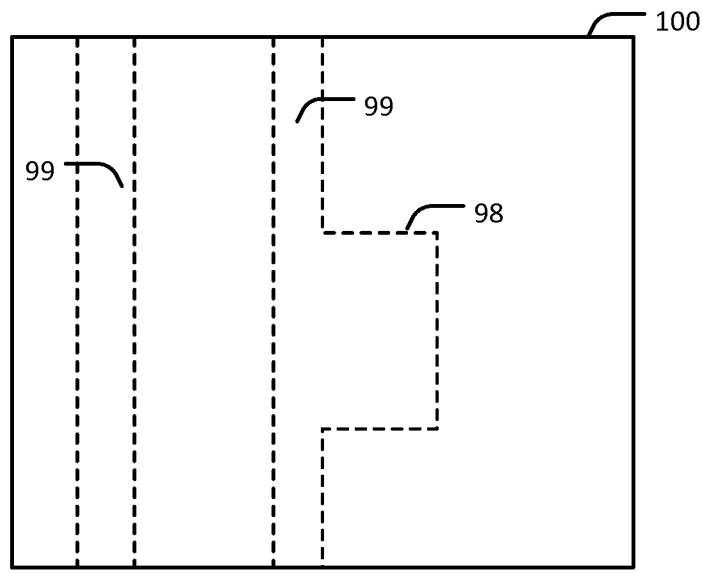
Figure 9D:
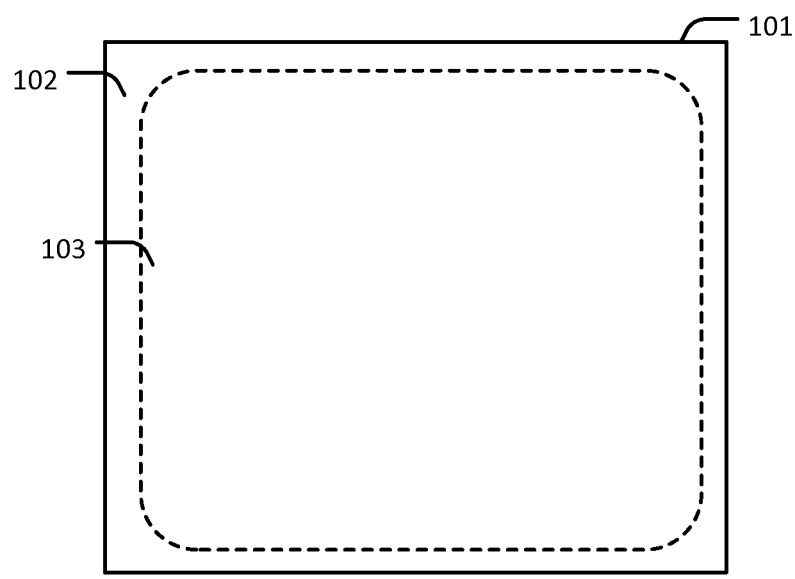
Figure 9E:
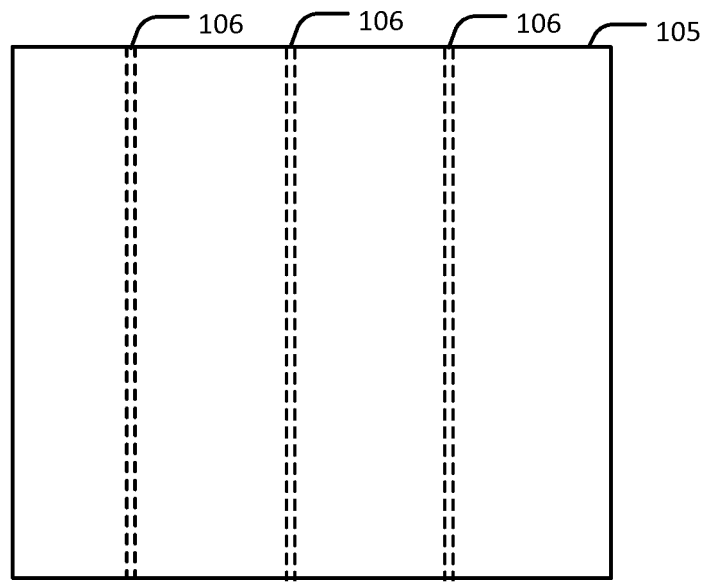

As illustrated in FIG. 9C, carrier forms can be created such that positive images create a planar routing of channels 99 and various embedding areas 98 for interconnecting devices and/or facilitating folding of a resulting substrate 100 while incorporating embedded components. In FIG. 9D, a central area 103 or a perimeter area 102 can be tailored in substrate 101 for embedding a larger central component (or differing material) or creating similar edges to those described with reference to FIG. 9B. In FIG. 9E, an embodiment is illustrated wherein relatively narrow areas of weakening 106 can be created to function as hinges of flexible material such that the substrate 105 can be folded in a z-formation or accordion-formation. Although described as weakened areas, it is understood that areas 106 can be relatively flexible while also being durable, as thinning of these areas creates increased flexibility while not disturbing the overlying cosmetic surface 15. Additionally, thin portions of a second flexible supportive material can be embedded in areas 106 in some embodiments. Furthermore, conductors or antennas can also be embedded in areas 106.

Figure 9F:
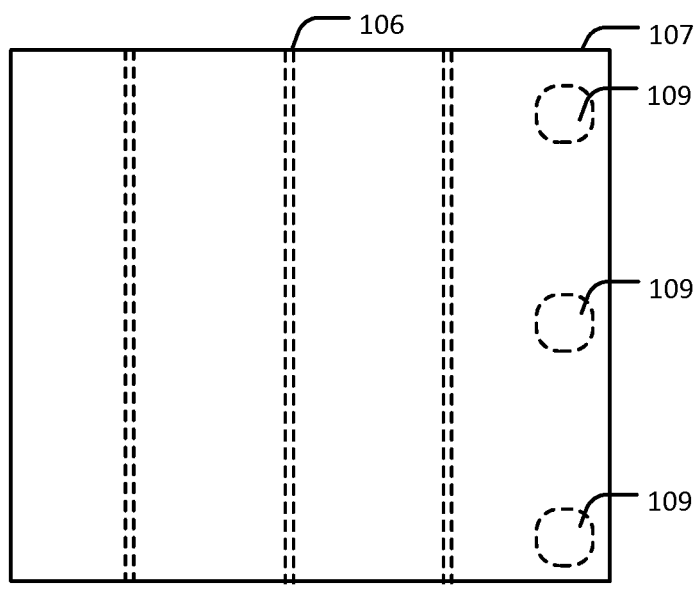
Figure 9G:
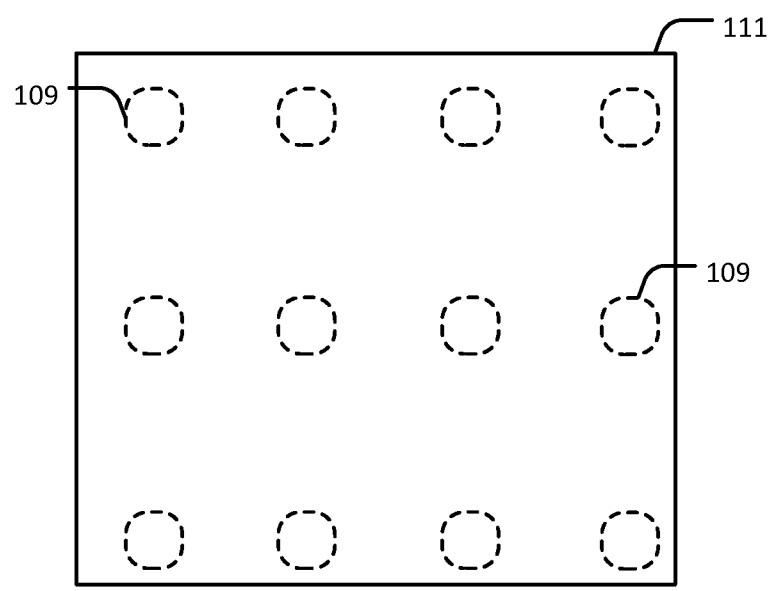
Figure 9H:
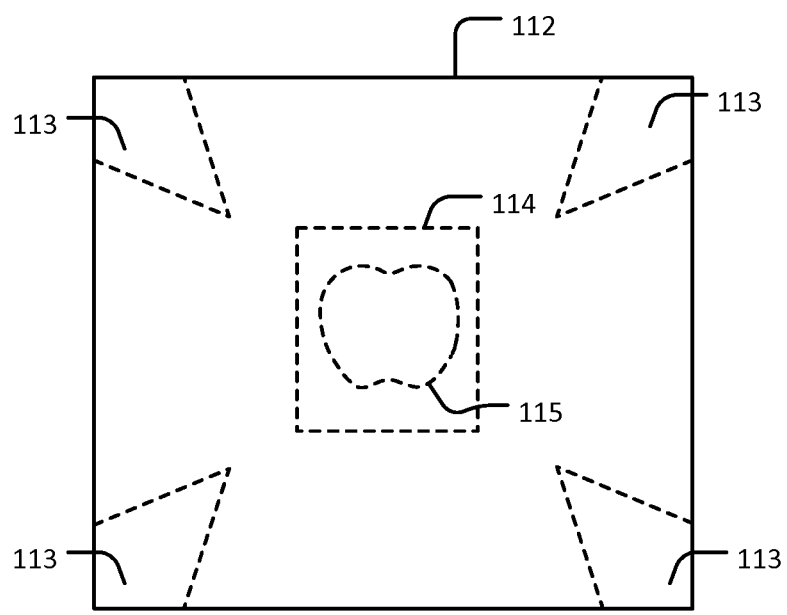

In FIG. 9F, an embodiment is illustrated wherein relatively thin areas 106 can be combined with a plurality of other cavities 109 in substrate 107 such that the features of both can be used in combination. Such an arrangement can be created in a single or multiple passes of material removal described above, depending upon a desired manufacturing process. For example, multiple carrier forms can be applied in sequence such that a method similar to method 50 is repeated as many times as desired to create any desired substrate configuration. In FIG. 9G, an embodiment is illustrated wherein a plurality of embedding cavities 109 can be dispersed or arranged in a grid formation on a substrate 111 for aesthetic or functional purposes. Additionally, FIG. 9H shows an embodiment wherein reduced corner areas 113 are formed in substrate 112 such that excess material proximate the corners can be folded over and inwardly to create a pleasing edge or perimeter for the substrate 112. Additionally, or in combination, indicia 114, and 115 can be created such that an ornamental design can be visible on a cosmetic surface of the substrate 112.

Thus, as described above, embodiments of the present invention provide for carrier forms of any suitable variety configured to transfer a positive image of a desired area of reduction (or cavity) to a substrate of material. Once applied to the substrate to form a carrier assembly, material opposite a cosmetic surface can be removed to alter the characteristics of the cosmetic surface such that an ornamental design is formed, functionality is increased, objects or components are embedded, and/or any suitable combination of the same is achieved. In some embodiments, a portion of the cosmetic surface can be removed through application of the carrier form on an opposing, lateral, or inner surface of the material substrate. All such modifications, combinations, and varieties are within the scope of some embodiments.

Figure 10:
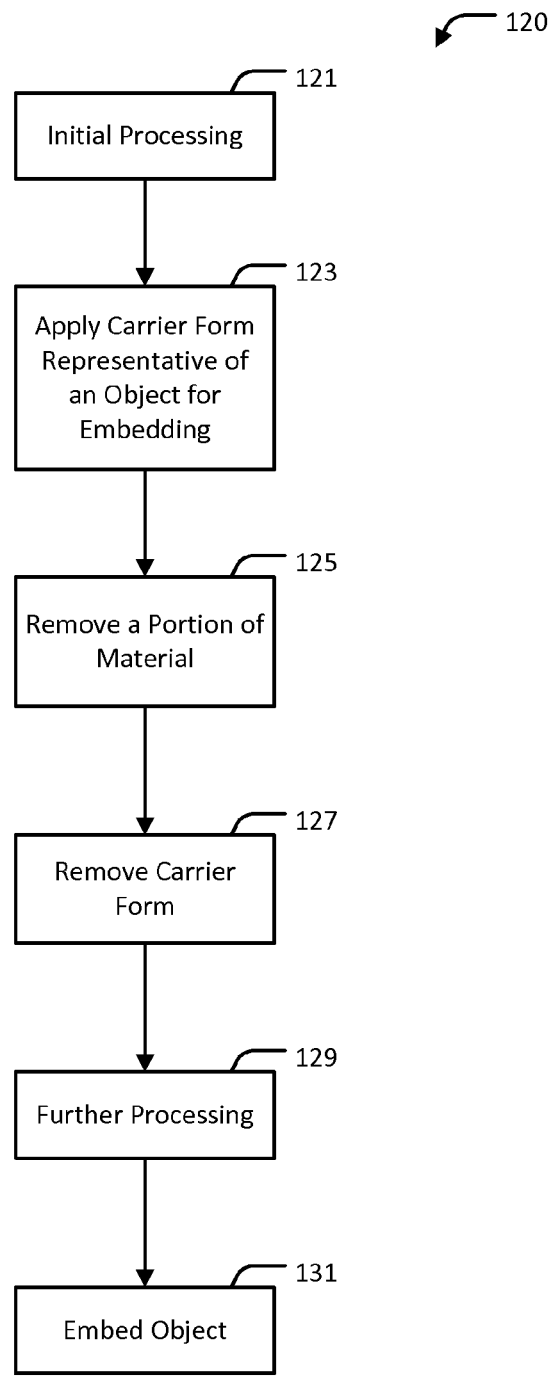
FIG. 10 shows a flowchart of a method of processing material for embedding of one or more components therein.

Hereinafter, several methods of processing material substrates for embedding components, creating cavities, reducing material thickness or density, and/or creating ornamental designs are described in detail with reference to FIGS. 10-14. FIG. 10 shows a flowchart of a method 120 of processing material for embedding of one or more components in accordance with an embodiment of the present invention. The method 120 includes initial processing at block 121 as discussed herein. Thereafter, the method 120 includes applying a carrier form representative of an object for embedding to a substrate at block 123 to create a carrier assembly. For example, the applied carrier form can include a positive image of an embedding cavity dimensioned and configured to receive the object for embedding. In addition to the positive image of the embedding cavity, the carrier form can include any other desirable features as well. Method 120 also includes removing a portion of material from the carrier assembly at block 125, for example, through processing in a system similar to system 70. Moreover, the method 120 further includes removing the carrier form from the processed carrier assembly at block 127, further processing at block 129 as discussed herein, and embedding the object at block 131.

Figure 11:
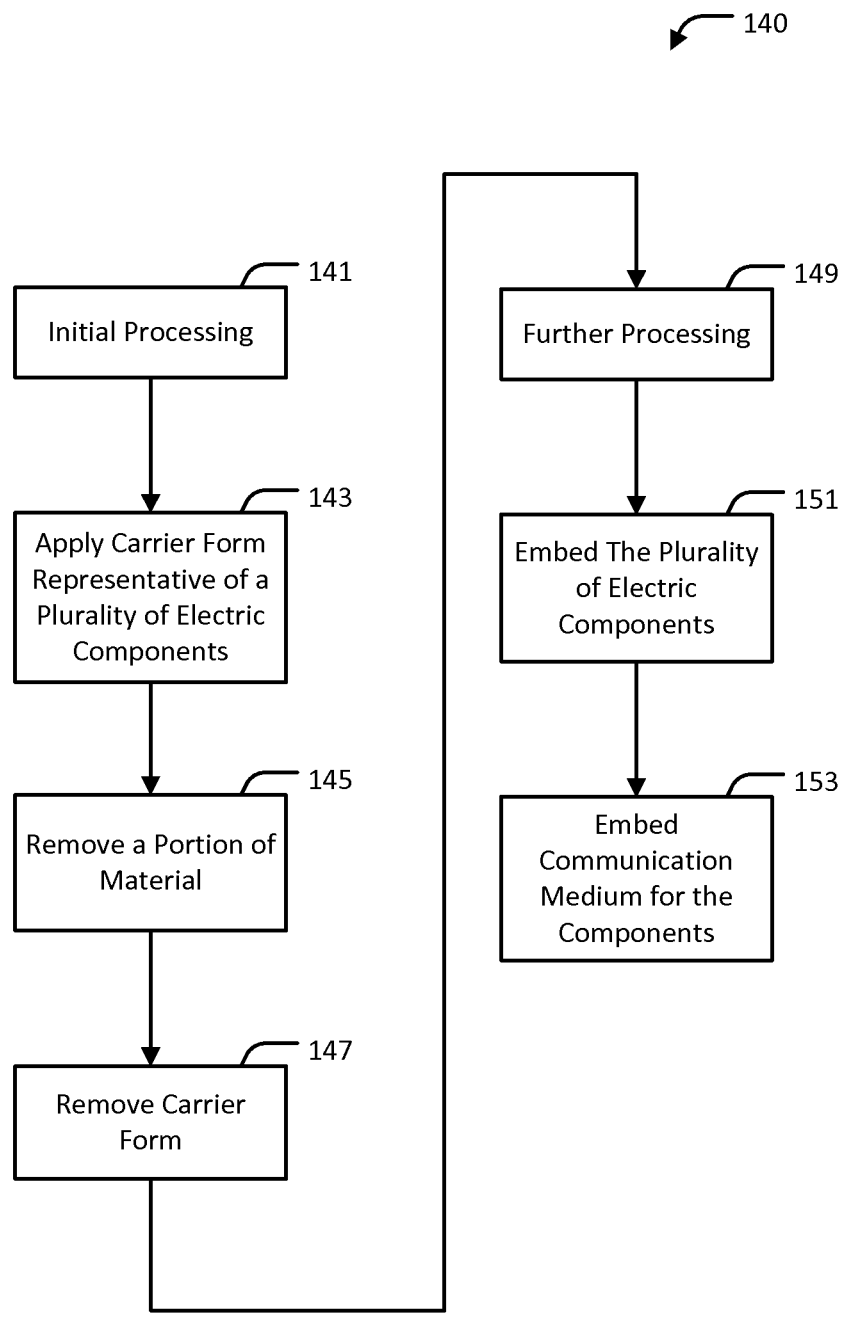
FIG. 11 shows a flowchart of a method of processing material for embedding of one or more electrical components.

FIG. 11 shows a flowchart of a method 140 of processing material for embedding of one or more electrical components in accordance with an embodiment of the present invention. The method 140 includes initial processing at block 141 as discussed herein. Thereafter, the method 140 includes applying carrier form representative of a plurality of electrical components to a substrate at block 143 to create a carrier assembly. For example, the carrier form can include one or more positive images representative of a plurality of electrical components, communications mediums/interconnections, and/or any other suitable features as well. The method 140 further includes removing a portion of material from the carrier assembly at block 145, removing the carrier form from the carrier assembly at block 147, and further processing at block 149 as discussed herein. Thereafter, the method 140 includes embedding the plurality of electrical components at block 151, embedding communication mediums for/between the electrical components, and/or interconnecting the plurality of electrical components at block 153.

Figure 12:
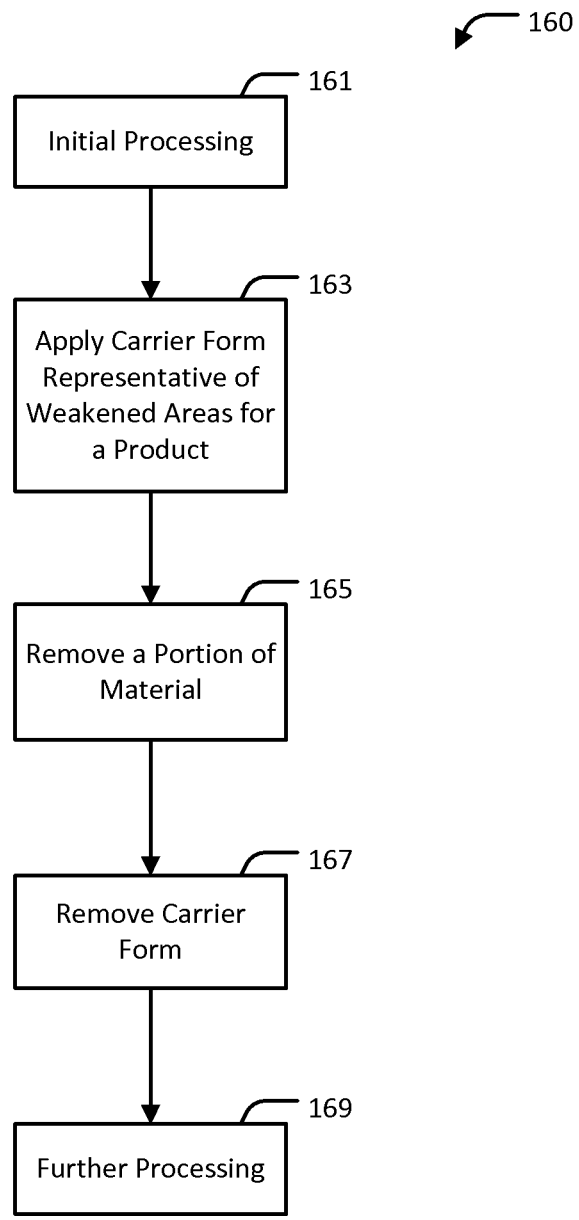
FIG. 12 shows a flowchart of a method of processing material for creating weakened areas in the processed material.

FIG. 12 shows a flowchart of a method 160 of processing material for creating weakened areas or areas of increased flexibility in the processed material in accordance with an embodiment of the present invention. The method 160 includes initial processing of a substrate at block 161 as discussed herein. The method 160 further includes applying a carrier form representative of desired areas of weakening or increased flexibility to a substrate at block 163 to create a carrier assembly. The carrier form can include one or more positive images to create the desired areas of increased flexibility or weakening. The method 160 can further include removing a portion of material from the carrier assembly at block 165, removing the carrier form from the carrier assembly at block 167, and further processing at block 169 as discussed herein.

Figure 13:
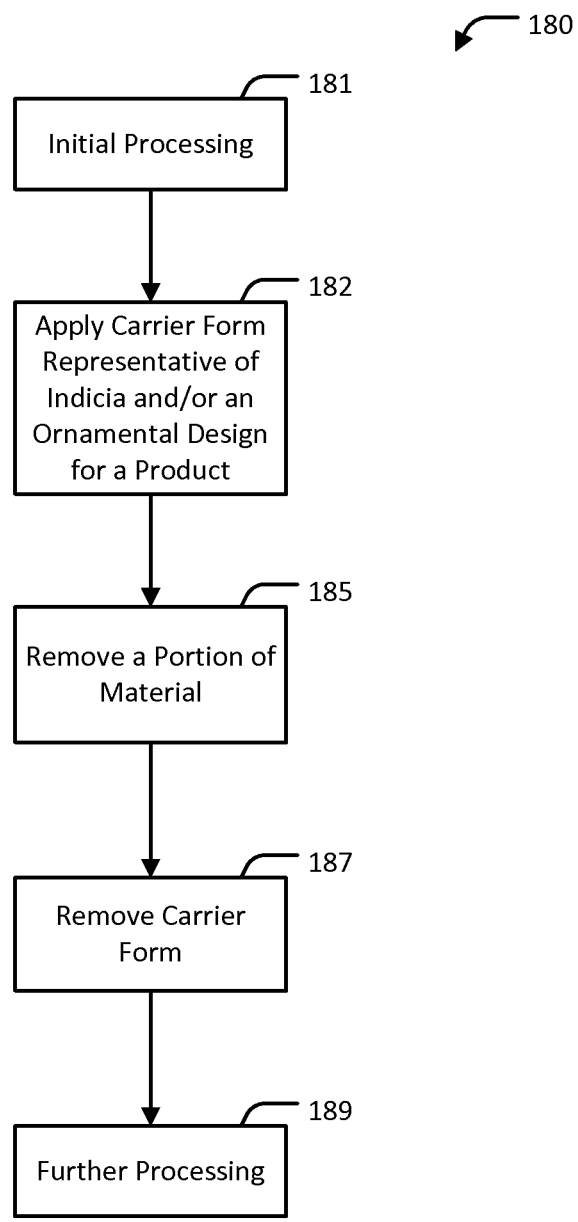
FIG. 13 shows a flowchart of a method of processing material for creating an ornamental design on the material.

FIG. 13 shows a flowchart of a method 180 of processing material for creating an ornamental design on the material in accordance with an embodiment of the present invention. The method 180 includes initial processing of a substrate at block 181 as discussed herein. The method 180 further includes applying a carrier form representative of a desired indicia and/or ornamental design to a substrate at block 183 to create a carrier assembly. For example, the carrier form can include one or more positive images or impressions of indicia and/or ornamental designs (e.g., a company logo, text or picture warnings, instructions, or any other suitable images or text). The method 180 can further include removing a portion of material from the carrier assembly at block 185, removing the carrier form from the carrier assembly at block 187, and further processing at block 189 as discussed herein.

Figure 14:
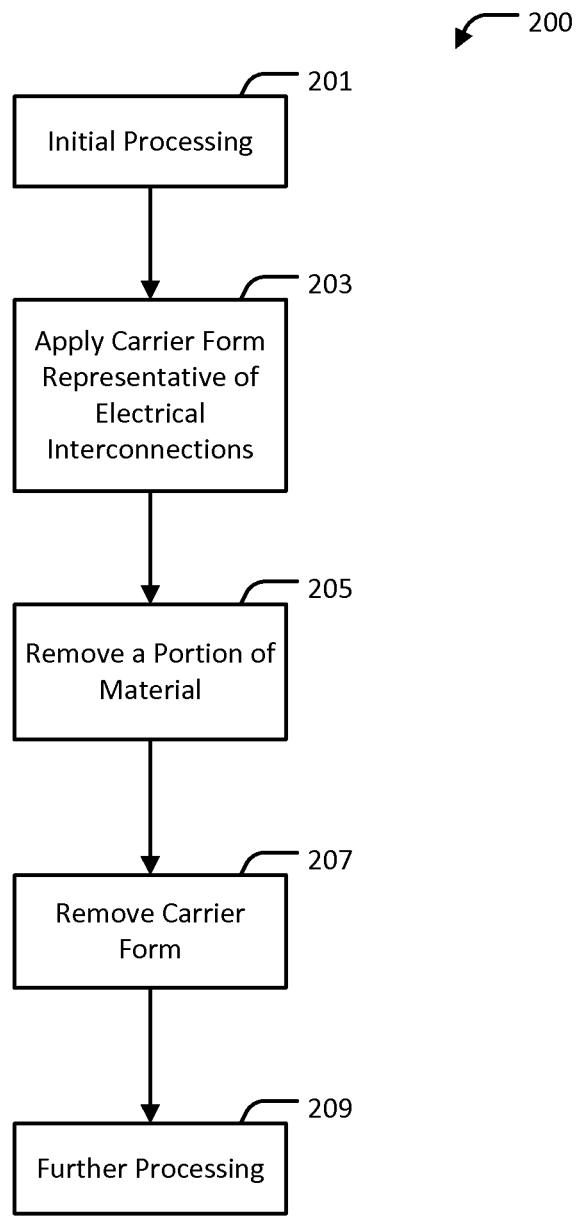
FIG. 14 shows a flowchart of a method of processing material for embedding of one or more electrical interconnections therein.

FIG. 14 shows a flowchart of a method 200 of processing material for embedding of one or more electrical interconnections in accordance with an embodiment of the present invention. The method 200 includes initial processing of a substrate at block 201 as discussed herein. The method 200 further includes applying a carrier form representative of electrical interconnections to a substrate at block 203 to create a carrier assembly. For example, the carrier form can include one or more positive images or impressions of electrical interconnections. For example, the positive image can be that of an antenna so that the material removed allows for the placement of an antenna into the substrate.

The method 200 further includes removing a portion of material from the carrier assembly at block 205, removing the carrier form from the carrier assembly at block 207, and further processing at block 209 as discussed herein. The method 200 can also include further material removal to create embedding cavities for components, sensors, electrical devices etc., and embedding of one or more of the components with a suitable electrical interconnection(s). Still further, the method can include embedding electrical interconnections and/or connection interfaces for establishing communication between the processed substrate and any personal electronic device to which the processed substrate can be severably attached.

It is understood that although described above as including discrete methods for forming/embedding based on an individual type of component, the same can be varied and/or combined with any teachings or methods described herein to allow for production of material substrates with any suitable feature herein described.

The various aspects, embodiments, implementations or features of the described embodiments can be used separately or in any combination. Various aspects of the described methods can be implemented by software, hardware, machinery, or a combination of hardware and software directing or controlling machinery. The methods can also be embodied as computer readable code on a computer readable medium for controlling manufacturing operations or as computer readable code on a computer readable medium for controlling a manufacturing line for processing of materials and/or embedding components and/or creating ornamental designs and/or introducing weakened or more flexible areas/hinges in a material. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for embedding a design in a flexible substrate that includes a cosmetic surface having a generally planar configuration, the method comprising:
   pressing a carrier form having a feature against the cosmetic surface, wherein pressing the carrier form against the cosmetic surface causes the cosmetic surface to take on a modified configuration by increasing an amount of tension across the cosmetic surface;
   removing a portion of the flexible substrate from an opposing surface of the flexible substrate; and
   removing the carrier form from the cosmetic surface, thereby reducing the amount of tension across the cosmetic surface such that the cosmetic surface reverts to the generally planar configuration and the opposing surface takes on the design based on the feature.

2. The method of claim 1, wherein the flexible substrate is formed from at least one of leather, synthetic leather, rubber, silicone, neoprene, cork, plastic, or felt.

3. The method of claim 1, wherein, removing the carrier form from the cosmetic surface causes an embedded cavity to be formed in the opposing surface having a size and shape that corresponds to an electrical component.

4. The method of claim 3, further comprising inserting the electrical component into the embedded cavity.

5. The method of claim 1, further comprising simultaneously rotating a roller and a blade relative to the flexible substrate, wherein the roller pulls the carrier form closer to the blade and the blade cuts a region of the flexible substrate.

6. The method of claim 5, wherein cutting the region of the flexible substrate causes the carrier form to deform a first amount of the flexible substrate when the blade makes contact with the flexible substrate such that a thickness or density of the flexible substrate moving above or below the blade during the cutting is varied.

7. The method of claim 6, further comprising discarding the first amount of the flexible substrate that moves below the blade during the cutting and retaining a second amount of the flexible substrate that moves above the blade during the cutting.

8. The method of claim 1, wherein removing the portion of the flexible substrate forms a modified opposing surface having increased flexibility relative to the opposing surface.

9. The method of claim 1, wherein the carrier form is pressed against the cosmetic surface by a roller.

10. The method of claim 9, wherein the roller moves the carrier form and the flexible substrate towards or away from a cutting tool that is capable of removing the portion of the flexible substrate.

11. The method of claim 1, wherein, prior to pressing the carrier form against the cosmetic surface, the method further comprises:
    pre-processing the flexible substrate, the pre-processing including at least one of splitting, milling, tanning, stretching, polishing, sealing, or applying a chemical to the flexible substrate.

12. A method for forming a design in a flexible substrate, the method comprising:
    pressing a template against a first surface of the flexible substrate characterized as having a generally planar configuration to increase an amount of tension across the first surface, wherein the template includes a positive image of a feature;
    cutting a portion of a second surface of the flexible substrate that is opposite the first surface; and
    removing the template to reduce the amount of tension across the first surface such that the first surface reverts to the generally planar configuration and the second surface takes on a cavity having a negative image of the feature.

13. The method of claim 12, wherein the flexible substrate is formed from at least one of leather, synthetic leather, rubber, silicone, neoprene, cork, plastic, or felt.

14. The method of claim 12, wherein the cavity has a size and shape that corresponds to an electrical component.

15. The method of claim 14, wherein the method further comprises:
    causing the electrical component to be inserted into the cavity.

16. The method of claim 15, wherein the cavity includes an adhesive that fixes a position of the electrical component within the cavity.

17. The method of claim 12, wherein removing the portion from the second surface comprises simultaneously causing a roller and a blade to rotate relative to the flexible substrate, wherein the roller pulls the template closer to the blade and the blade cuts the portion of the flexible substrate.

18. The method of claim 17, wherein cutting the portion causes the template to deform a first amount of the flexible substrate when the blade makes contact with the flexible substrate such that a thickness or density of the flexible substrate moving above or below the blade during the cutting process varies.

19. The method of claim 18, wherein the method further comprises:
   causing the first amount of the flexible substrate that moves below the blade during the cutting to be discarded and retaining a second amount of the flexible substrate that moves above the blade during the cutting.

20. The method of claim 12, wherein, subsequent to removing the template, the method further comprises:
   treating the flexible substrate with firming or reinforcing materials.

\* \* \* \* \*